United States Patent
Kamei

(10) Patent No.: US 7,440,322 B2
(45) Date of Patent: Oct. 21, 2008

(54) METHOD AND SYSTEM FOR FLASH MEMORY DEVICES

(75) Inventor: Teruhiko Kamei, Kanagawa (JP)

(73) Assignee: SanDisk Corporation, Milpitas, CA (US)

( * ) Notice: Subject to any disclaimer, the term of this patent is extended or adjusted under 35 U.S.C. 154(b) by 75 days.

(21) Appl. No.: 11/407,816

(22) Filed: Apr. 20, 2006

(65) Prior Publication Data

US 2007/0247909 A1    Oct. 25, 2007

(51) Int. Cl.
*G11C 16/04*    (2006.01)

(52) U.S. Cl. .............................. 365/185.17; 365/185.18; 365/185.22

(58) Field of Classification Search ............ 365/185.17, 365/185.18, 185.2, 185.22, 185.28
See application file for complete search history.

(56) References Cited

U.S. PATENT DOCUMENTS

| | | | |
|---|---|---|---|
| 5,570,315 A | 10/1996 | Tanaka et al. | |
| 5,774,397 A | 6/1998 | Endoh et al. | |
| 5,946,231 A | 8/1999 | Endoh et al. | |
| 5,949,714 A | 9/1999 | Hemink et al. | |
| 6,046,935 A | 4/2000 | Takeuchi et al. | |
| 6,151,249 A * | 11/2000 | Shirota et al. | 365/185.17 |
| 6,456,528 B1 | 9/2002 | Chen | |
| 6,522,580 B2 | 2/2003 | Chen et al. | |
| 6,707,078 B1 | 3/2004 | Shiraiwa et al. | |
| 6,888,758 B1 | 5/2005 | Hemink et al. | |
| 6,987,696 B1 | 1/2006 | Wang et al. | |
| 7,006,384 B2 | 2/2006 | Banks | |
| 7,020,017 B2 | 3/2006 | Chen et al. | |
| 7,023,739 B2 * | 4/2006 | Chen et al. | 365/185.28 |
| 7,079,437 B2 * | 7/2006 | Hazama et al. | 365/185.17 |
| 7,239,556 B2 * | 7/2007 | Abe et al. | 365/185.33 |
| 7,272,049 B2 * | 9/2007 | Kang et al. | 365/185.2 |
| 2006/0239077 A1 * | 10/2006 | Park et al. | 365/185.17 |

* cited by examiner

*Primary Examiner*—Gene N. Auduong
(74) *Attorney, Agent, or Firm*—Vierra Magen Marcus & DeNiro LLP

(57) ABSTRACT

Method and system for memory devices is provided. The system includes a plurality of non-volatile storage elements connected in a string between a source side element and a drain side element; a plurality of bit lines, wherein each bit line is connected to a plurality of non-volatile storage elements; and a plurality of word lines, the plurality of word lines include a dummy word line between a source side select element and a first word line that is connected to a first non-volatile storage element to be programmed, wherein a program voltage is applied to the first non-volatile storage element connected to the first word line and an intermediate voltage is applied to a second non-volatile storage element connected to the dummy word line.

19 Claims, 11 Drawing Sheets

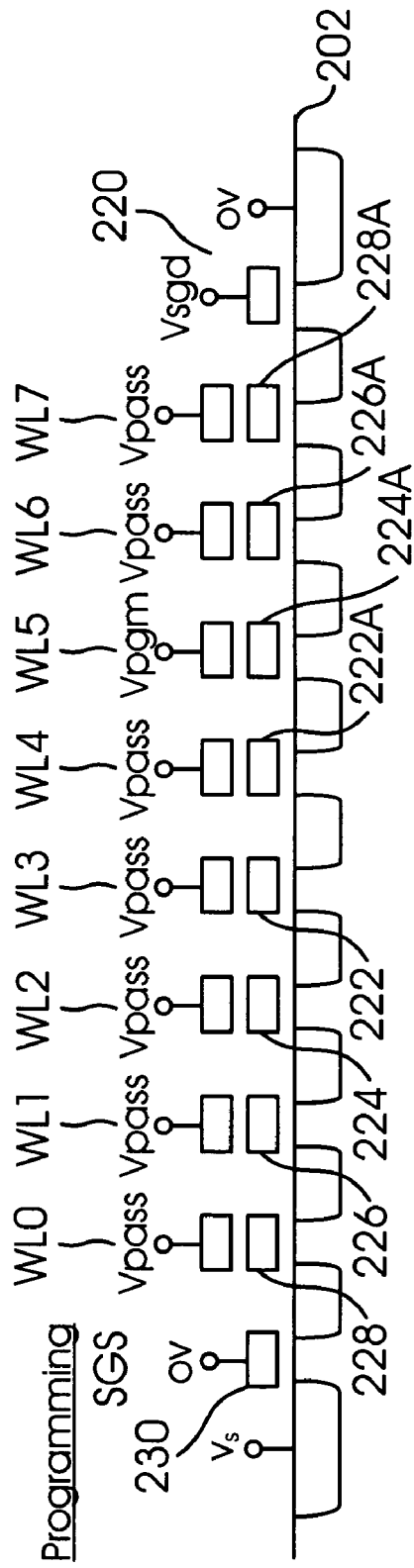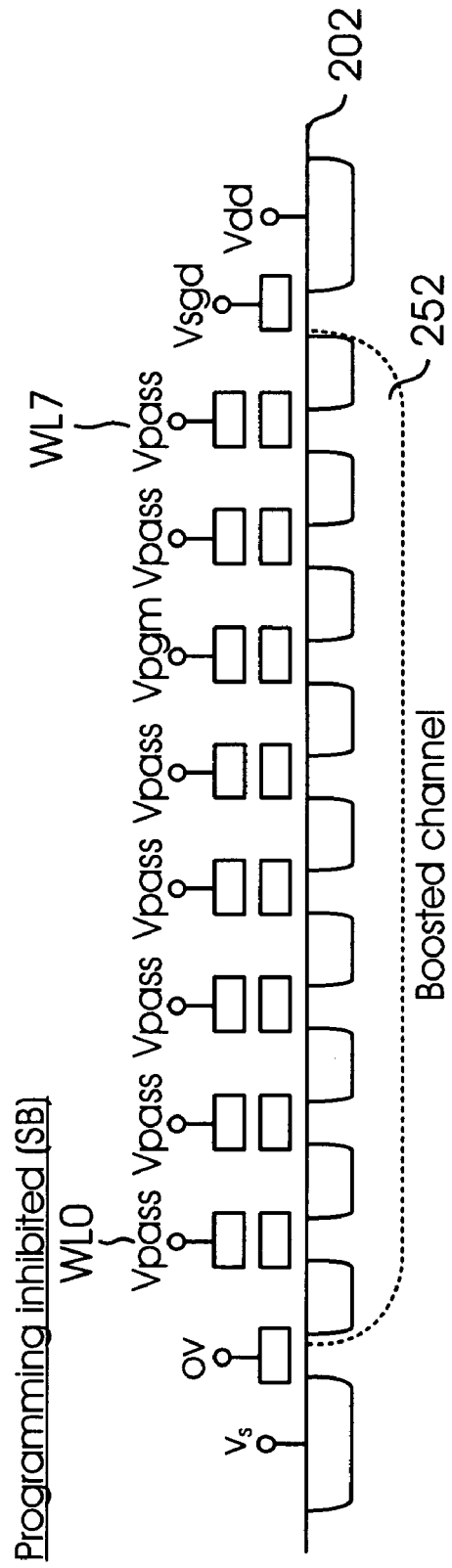

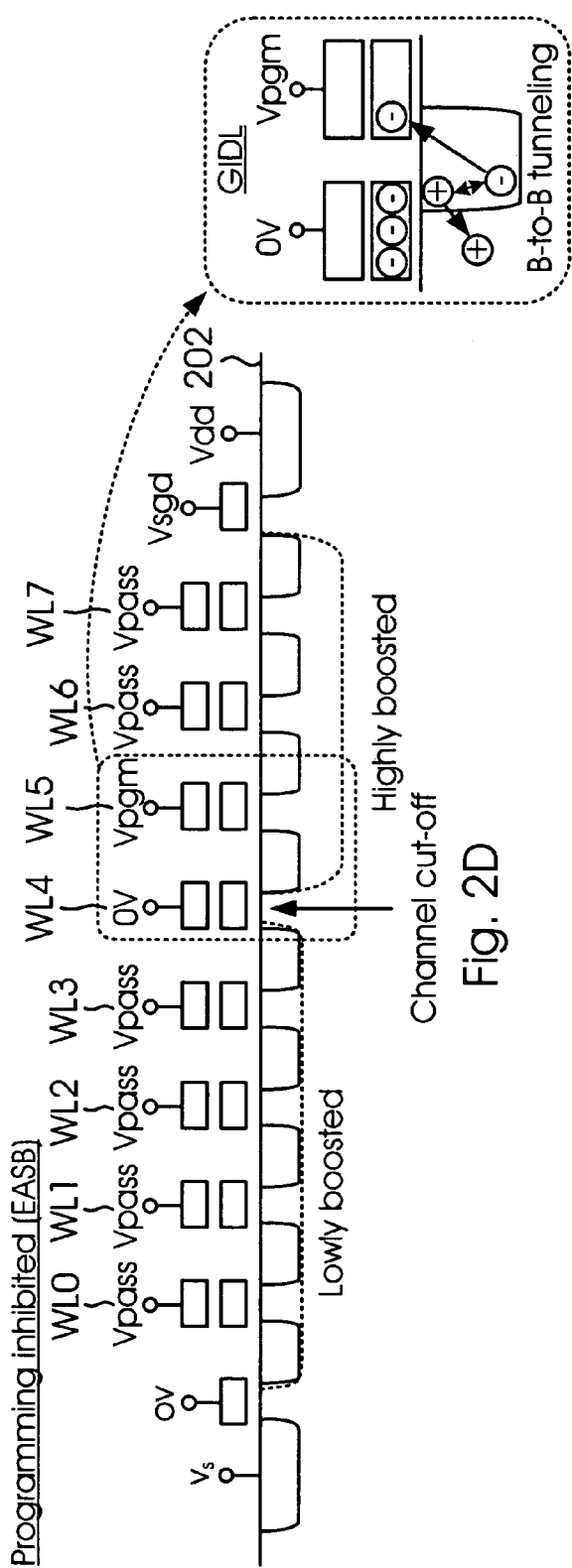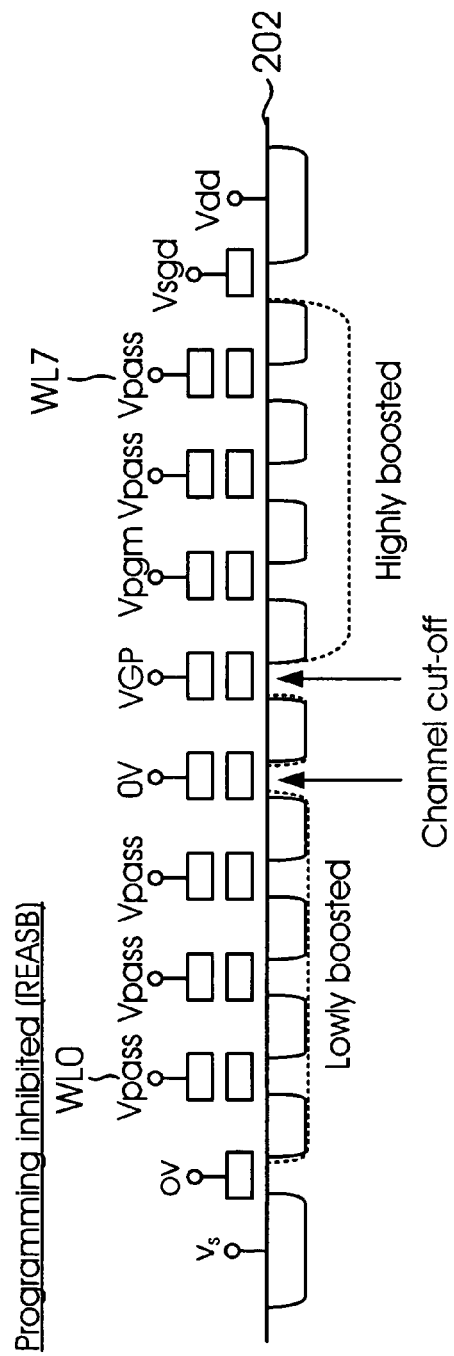
Fig. 2D
Fig. 2E

Read

| | 33-NAND | 32-NAND |
|---|---|---|
| Selected WL | VCGRV | VCGRV |
| Unselected WL | VREAD | VREAD |
| Dummy WL | VREAD | - |

400A  400B

Program (REASB)

| | | 33-NAND | 32-NAND |
|---|---|---|---|
| Selected WL | WLn | VPGM | VPGM |
| Unselected WL | WLn+1-31 | VPASS | VPASS |
| | WLn-1 | VGP | VGP |
| | WLn-2 | 0V | 0V |
| | WL0-n-3 | VPASS | VPASS |
| Dummy WL | | VGPd | - |

400C  400D   <= Dummy WL is never programmed.

Erase

| | 33-NAND | 32-NAND |
|---|---|---|
| WLs in Sel Block | 0V | 0V |
| Dummy WL in Sel Block | 0V | - |
| WLs in Unsel Block | Floating (VERA*CR) | Floating (VERA*CR) |

400E  400F   <= Dummy WL is erased when the block is erased.

Soft Program

| | 33-NAND | 32-NAND |
|---|---|---|
| WLs in Sel Block | VSPGM | VSPGM |
| Dummy WL in Sel Block | VSPGM | - |
| WLs in Unsel Block | Floating (0V) | Floating (0V) |

400G  400H   <= Dummy WL is soft-programmed when the block is soft-programmed.

METHOD AND SYSTEM FOR FLASH MEMORY DEVICES

BACKGROUND

Field of the Invention

The present invention is related to flash memory devices/systems, and more particularly, to NAND Flash memory cell array programming techniques.

Semiconductor memory devices have become more popular for use in various electronic devices. For example, non-volatile semiconductor memory is used in cellular telephones, digital cameras, personal digital assistants, mobile computing devices, non-mobile computing devices and other electronic devices. Electrical Erasable Programmable Read Only Memory (EEPROM) and flash memory are among the most popular non-volatile semiconductor memories.

One example of a flash memory system uses the NAND structure, which includes arranging multiple transistors in series, sandwiched between two select gates. A NAND array has a number of memory cells, such as 8, 16, or even 32, connected in series string (NAND string) between a bit line and a reference potential through select transistors at either end. Word lines are connected with control gates of cells in different series strings.

To program a flash memory cell, a program voltage is applied to the control gates and the bit line is grounded causing the threshold voltage of the cell to be raised. Because the program voltage is applied to all cells connected to a word line an unselected cell (a cell that is not to be programmed) on the word line, especially a cell adjacent to the cell selected for programming, may become inadvertently programmed. The unintentional programming of the unselected cell on the selected word line is referred to as "program disturb."

Continuous efforts are being made to improve programming techniques of NAND memory cells so that more information can be stored efficiently and program disturbs are prevented.

SUMMARY OF THE INVENTION

In one aspect of the present invention, a memory system is provided. The memory system includes a plurality of non-volatile storage elements connected in a string between a source side element and a drain side element; a plurality of bit lines, wherein each bit line is connected to a plurality of non-volatile storage elements; and a plurality of word lines, the plurality of word lines include a dummy word line between a source side select element and a first word line that is connected to a first non-volatile storage element to be programmed, wherein a program voltage is applied to the first non-volatile storage element connected to the first word line and an intermediate voltage is applied to a second non-volatile storage element connected to the dummy word line.

In another aspect of the present invention, a method of programming a memory system is provided. The method includes applying a program voltage to a first non-volatile storage element connected to a first word line of a string of non-volatile storage elements; and applying an intermediate voltage to a second non-volatile storage element connected to a dummy word line that is placed between a source side select element and the first word line.

In yet another aspect of the present invention, a memory system is provided. The memory system includes a plurality of non-volatile storage elements connected in a string between a source side element and a drain side element; a plurality of bit lines, wherein each bit line is connected to a plurality of non-volatile storage elements; and a plurality of word lines, the plurality of word lines include a dummy word line between a drain side select element and a last word line that is connected to a first non-volatile storage element to be programmed, wherein a program voltage is applied to first the non-volatile storage element connected to the last word line and an intermediate voltage is applied to a second non-volatile storage element connected to the dummy word line.

This brief summary has been provided so that the nature of the invention may be understood quickly. A more complete understanding of the invention can be obtained by reference to the following detailed description of the preferred embodiments thereof in connection with the attached drawings.

BRIEF DESCRIPTION OF THE DRAWINGS

The foregoing features and other features of the present invention will now be described with reference to the drawings of a preferred embodiment. The illustrated embodiment is intended to illustrate, but not to limit the invention. The drawings include the following:

FIG. 2B shows an 8-cell NAND string being programmed;

FIG. 2C shows the affect of a self boosting technique for an 8-cell NAND string;

FIG. 2D shows the GIDL affect for a 8-cell NAND string;

FIG. 2E shows application of an intermediate voltage when a memory cell is being programmed;

FIG. 4B shows various tables for programming a NAND string with a dummy word line, according to one aspect of the present invention.

DETAILED DESCRIPTION OF THE PREFERRED EMBODIMENTS

To facilitate an understanding of the preferred embodiment, the general architecture and operation of a NAND string will be described. The specific architecture and operation of the preferred embodiment will then be described with reference to the general architecture.

General Description of the NAND Structure

Figure 1A:
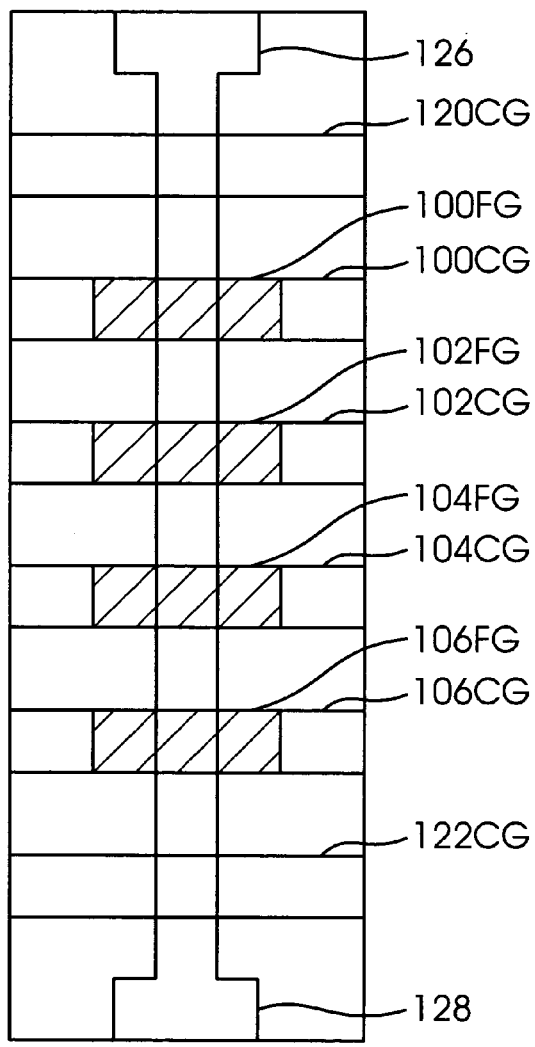
FIG. 1A is a top view of a NAND string.
Figure 1B:
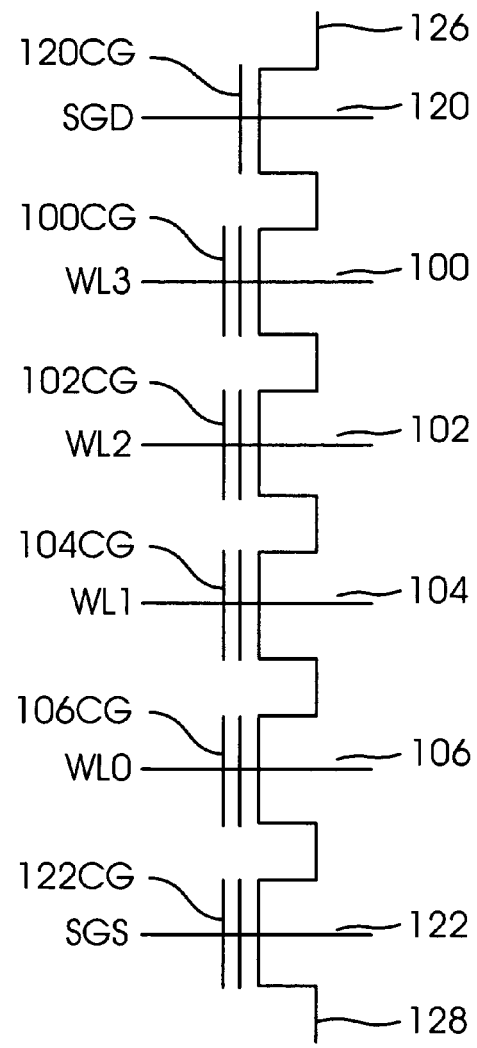
FIG. 1B is an equivalent circuit diagram of the NAND string.

FIG. 1A shows a top-view of a NAND structure where multiple transistors in series are sandwiched between two select gates. The transistors in series and the select gates are referred to as a NAND string. (Transistor and gates are also referred to non-volatile storage elements.) FIG. 1A shows a 4 memory cell NAND string. FIG. 1B shows an equivalent circuit of FIG. 1A.

The NAND string depicted in FIGS. 1A and 1B includes four transistors 100, 102, 104 and 106 in series and sandwiched between a first select gate 120 and a second select gate 122. Select gate 120 connects the NAND string to bit line 126. Select gate 122 connects the NAND string to source line 128. Select gate 120 is controlled by applying the appropriate voltages to control gate 120CG for select gate 120. Select gate 122 is controlled by applying the appropriate voltages to control gate 122CG of select gate 122. Each of the transistors 100, 102, 104 and 106 has a control gate and a floating gate. For example, transistor 100 includes control gate 100CG and floating gate 100FG. Transistor 102 includes control gate 102CG and a floating gate 102FG. Transistor 104 includes control gate 104CG and floating gate 104FG. Transistor 106 includes control gate 106CG and floating gate 106FG. Control gate 100CG is connected to word line WL3, control gate 102CG is connected to word line WL2, control gate 104CG is connected to word line WL1, and control gate 106CG is connected to word line WL0.

Figure 1C:
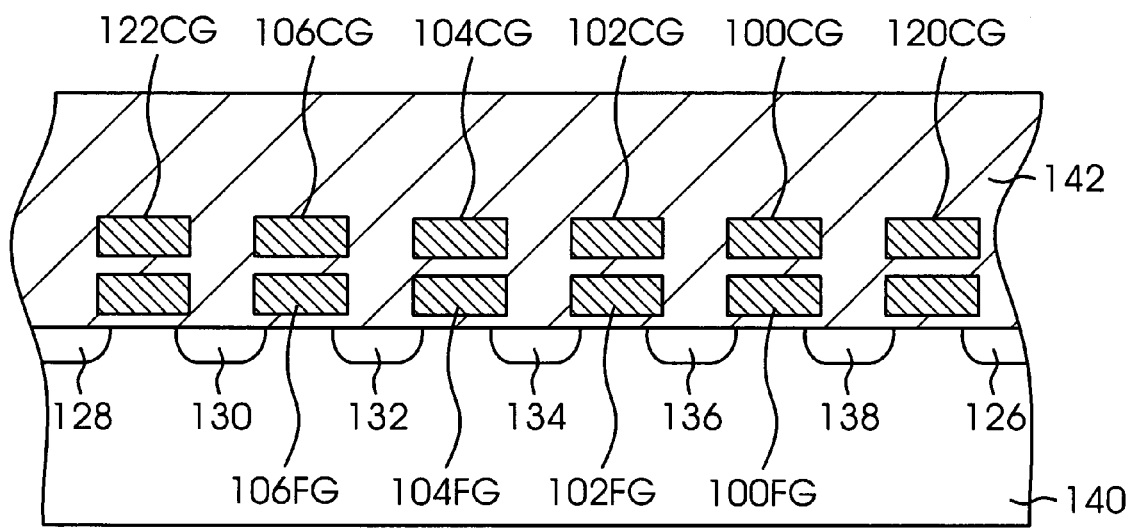
FIG. 1C is a cross sectional view of the NAND string of FIG. 1A.

FIG. 1C is a cross-sectional view of the NAND string 142 described above. As depicted in FIG. 1C, the transistors (also called cells or memory cells) of the NAND string are formed in p-well region 140. Each transistor includes a stacked gate structure that consists of control gate (100CG, 102CG, 104CG and 106CG) and floating gate (100FG, 102FG, 104FG and 106FG). The floating gates are formed on the surface of p-well region 140 on top of an oxide film. The control gate is above the floating gate, with an oxide layer separating the control gate and floating gate.

Note that FIG. 1C appears to depict a control gate and floating gate for transistors 120 and 122. However, for transistors 120 and 122, the control gate and the floating gate are connected together. The control gates of memory cells (100, 102, 104, 106) form the word lines. N+ diffused layers 130, 132, 134, 136 and 138 are shared between neighboring cells whereby the cells are connected to one another in series to form a NAND string. These N+ diffused layers form the source and drain of each of the cells. For example, N+ diffused layer 130 serves as the drain of transistor 122 and the source for transistor of 106, N+ diffused layer 132 serves as the drain for transistor 106 and the source for transistor 104, N+ diffused region 134 serves as the drain for transistor 104 and the source for transistor 102, N+ diffused region 136 serves as the drain for transistor 102 and the source for transistor 100, and N+ diffused layer 138 serves as the drain for transistor 100 and the source for transistor 120. N+ diffused layer 126 connects to the bit line for the NAND string, while N+ diffused layer 128 connects to a common source line for multiple NAND strings.

Note that although FIGS. 1A-1C shows four memory cells in the NAND string, the use of four transistors is only provided as an example. A NAND string can have less than four memory cells or more than four memory cells. For example, some NAND strings will include 8 memory cells (as shown and described below with respect to FIGS. 2B-2F), 16 memory cells, 32 memory cells, etc. The discussion herein is not limited to any particular number of memory cells in a NAND string.

Figure 2A:
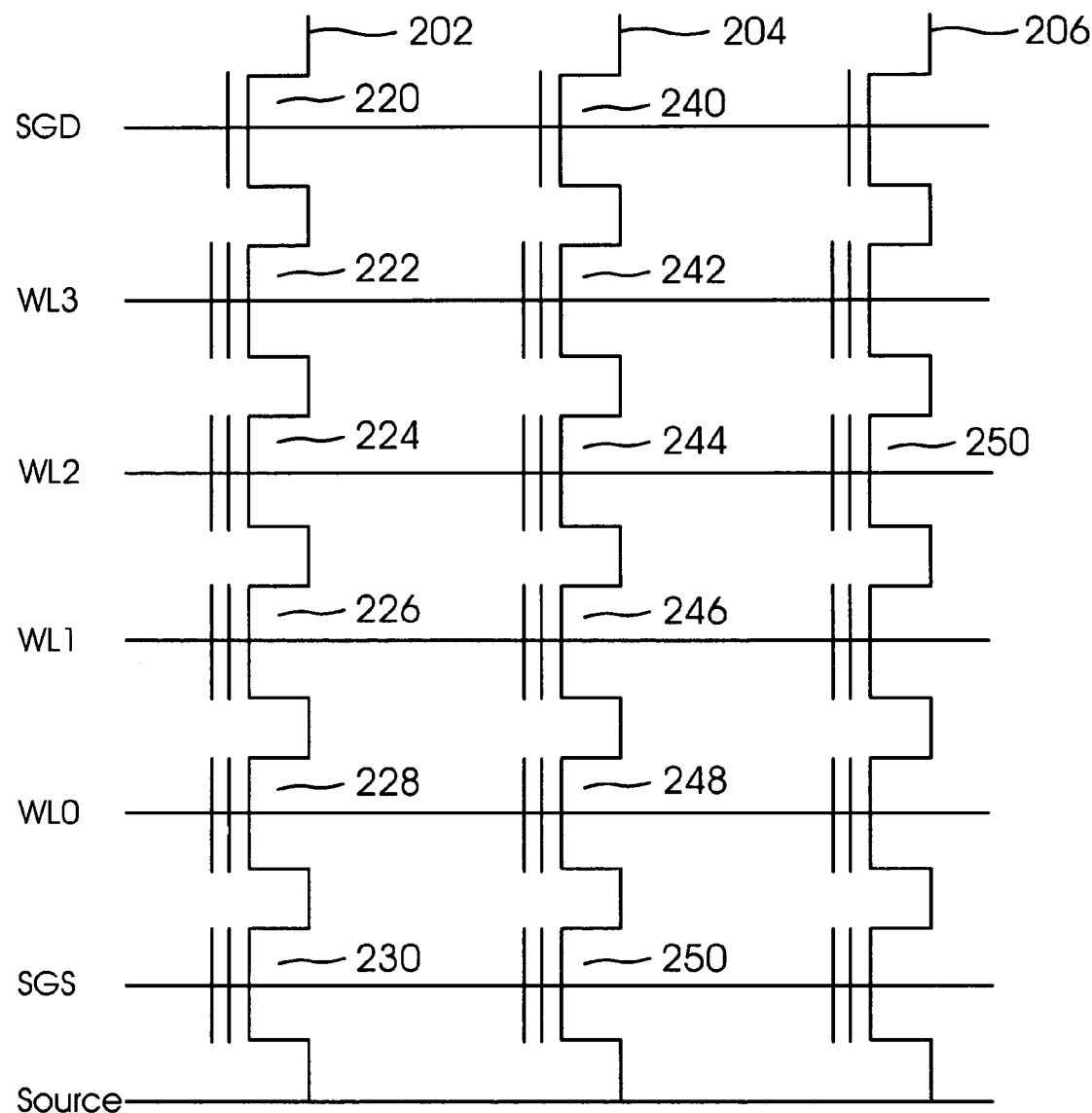
FIG. 2A is a circuit diagram depicting three NAND strings.

FIG. 2A shows three NAND strings 202, 204 and 206 of a memory array having many more NAND strings. Each of the NAND strings of FIG. 2A includes two select transistors and four memory cells. For example, NAND string 202 includes select transistors 220 and 230, and memory cells 222, 224, 226 and 228. NAND string 204 includes select transistors 240 and 250, and memory cells 242, 244, 246 and 248. Each string is connected to the source line by its select transistor (e.g. select transistor 230 and select transistor 250). A selection line SGS is used to control the source side select gates. The various NAND strings are connected to respective bit lines by select transistors 220, 240, etc., which are controlled by select line SGD.

In other embodiments, the select lines do not necessarily need to be in common. Word line WL3 is connected to the control gates for memory cell 222 and memory cell 242. Word line WL2 is connected to the control gates for memory cell 224 and memory cell 244. Word line WL1 is connected to the control gates for memory cell 226, memory cell 246 and memory cell 250. Word line WL0 is connected to the control gates for memory cell 228 and memory cell 248. As can be seen, each bit line and the respective NAND string comprise the columns of the array of memory cells. The word lines (WL3, WL2, WL1 and WL0) comprise the rows of the array and each word line connects the control gates of each memory cell in the row as described above.

FIG. 2B shows an example of an 8 memory cell NAND string. The additional word lines are shown as WL4-WL7 (for memory cells 222A-228A) and have similar functionality as word lines WL0-WL3.

Each memory cell can store data (analog or digital). When storing one bit of digital data, the range of possible threshold voltages of the memory cell is divided into two ranges which are assigned logical data "1" and "0." In one example of a NAND type flash memory, the voltage threshold is negative after the memory cell is erased, and defined as logic "1." The threshold voltage after a program operation is positive and defined as logic "0." When the threshold voltage is negative and a read is attempted, the memory cell will turn on to indicate logic one is being stored. When the threshold voltage is positive and a read operation is attempted, the memory cell will not turn on, which indicates that logic zero is stored.

A memory cell can also store multiple levels of information (or "data"), for example, multiple bits of digital data. In the case of storing multiple levels of data, the range of possible threshold voltages is divided into the number of levels of data. For example, if four levels of information is stored, there will be four threshold voltage ranges assigned to the data values "11", "10", "01", and "00." In one example of a NAND type memory, the threshold voltage after an erase operation is negative and defined as "11". Positive threshold voltages are used for the states of "10", "01", and "00."

Relevant examples of NAND type flash memories and their operation are provided in the following U.S. patents/patent applications, all of which are incorporated herein by reference: U.S. Pat. Nos. 5,570,315; 5,774,397, 6,046,935, 6,456, 528 and U.S. patent application. Ser. No. 09/893,277 (Publication No. US2003/0002348).

When programming a flash memory cell, a program voltage is applied to the control gate and the bit line is grounded. Electrons from the p-well are injected into the floating gate. When electrons accumulate in the floating gate, the floating gate becomes negatively charged and the threshold voltage of the cell is raised. To apply the program voltage to the control gate of the cell being programmed, that program voltage is applied on the appropriate word line. As discussed above, that word line is also connected to one cell in each of the other NAND strings that utilize the same word line. For example, when programming cell 224 of FIG. 2A, the program voltage will also be applied to the control gate of cell 244 because both cells share the same word line.

A problem arises when it's desired to program one cell on a word line without programming other cells connected to the same word line, for example, when it's desired to program cell 224 and not cell 244. Because the program voltage is applied to all cells connected to a word line an unselected cell (a cell that is not to be programmed) on the word line, especially a cell adjacent to the cell selected for programming, may become inadvertently programmed. For example, cell 244 is adjacent to cell 224. When programming cell 224, there is a concern that cell 244 might unintentionally be programmed. The unintentional programming of the unselected cell on the selected word line is referred to as "program disturb."

Several techniques can be employed to prevent program disturb. In one method known as "self boosting," the unselected bit lines are electrically isolated and a pass voltage (e.g. 10 volts) is applied to the unselected word lines during programming. The unselected word lines couple to the unselected bit lines, causing a voltage (e.g. eight volts) to exist in the channel of the unselected bit lines, which tends to reduce program disturb. Self boosting causes a voltage boost to exist in the channel which tends to lower the voltage across the tunnel oxide and hence reduce program disturb. FIG. 2C shows an example of the self-boosting technique with a boosted channel 252.

A NAND string is typically (but not always) programmed from the source side to the drain side, for example, from memory cell 228 to memory cell 228A. When the programming process is ready to program the last (or near the last) memory cell of the NAND string, if all or most of the previously programmed cells on the string being inhibited (e.g. string 204) were programmed, then there is negative charge in the floating gates of the previously programmed cells. Because of this negative charge on the floating gates, the boosting potential doesn't get high enough and there still may be program disturb on the last few word lines. For example, when programming cell 222, if cells 248, 246 and 244 were programmed, then each of those transistors (244, 246, 248) have a negative charge on their floating gate which will limit the boosting level of the self boosting process and possibly cause program disturb on cell 242.

Erased Area Self Boosting

The problem discussed above with self boosting has been addressed by two other schemes: Local Self Boosting ("LSB") and Erased-Area Self Boosting ("EASB"). Both LSB and EASB attempt to isolate the channel of previously programmed cells from the channel of the cell being inhibited. For example, if cell 224 of FIG. 2A (or 2B) is being programmed, LSB and EASB attempt to inhibit programming in cell 244 by isolating the channel of cell 244 from the previously programmed cells (246 and 248). With the LSB technique, the bit line for the cell being programmed is at ground and the bit line of the string with the cell being inhibited is at Vdd. The program voltage Vpgm (e.g. 20 volts) is driven on the selected word line. The word lines neighboring the selected word line are at zero volts and the remaining non-selected word lines are at Vpass. For example, looking at FIG. 2A, bit line 202 is at zero volts and bit line 204 is at Vdd. Drain select SGD is at Vdd and source select SGS is at zero volts. Selected word line WL2 (for programming cell 224) is at Vpgm. Neighboring word lines WL1 and WL3 are at zero volts, and other word lines (e.g. WL0) are at Vpass. The same is shown in FIG. 2B for an 8-memory cell NAND string.

EASB is similar to LSB with the exception that only the source side neighbor word line is at zero volts. FIG. 2D shows an example of EASB. When WL5 is being programmed, WL4 is at zero volts, which cuts-off the channel and WL3 is at Vpass. In one embodiment, Vpass is 7-10 volts. If Vpass is too low, boosting in the channel is insufficient to prevent program disturb. If Vpass is too high, unselected word lines will be programmed.

Gate Induced Drain Leakage (GIDL):

While LSB and EASB provide an improvement over self boosting, they also present a problem that depends on whether the source side neighbor cell (cell 246 is the source side neighbor of cell 244) is programmed or erased. If the source side neighbor cell is programmed, then there is a negative charge on the floating gate of that source side neighbor cell. Zero volts are applied to the control gate. Thus, there is a highly reverse biased junction under the negatively charged gate which can cause Gate Induced Drain Leakage (GIDL). GIDL involves electrons leaking into the boosted channel due to band-to band (B-to-B tunneling). GIDL occurs with a large bias in the junction and a low or negative gate voltage, which is precisely the case when the source side neighbor cell is programmed and the drain junction is boosted. GIDL will cause the boosted voltage to leak away prematurely, resulting in a programming error. GIDL is more severe with the abruptly and highly doped junctions, which are required as cell dimensions are scaled. If the leakage current is high enough, the boosting potential in the channel region will go down and there can be program disturb. The closer the word line being programmed is to the drain, the less charge is present in the boosted junction. Thus, the voltage in the boosted junction will drop quickly, causing a program disturb. Even if the leakage current is not high enough, electrons induced by GIDL are easily injected into the floating gate in a high electric field between the gate and the channel. It will also cause program disturb.

FIG. 2D shows an example of GIDL when Vpgm is applied to WL5, WL4 is at zero volts and Vpass is applied to the other word lines. Positive charges are shown as having leaked into p-well and electrons left are shown as having been injected into the floating gate.

Figure 2F:
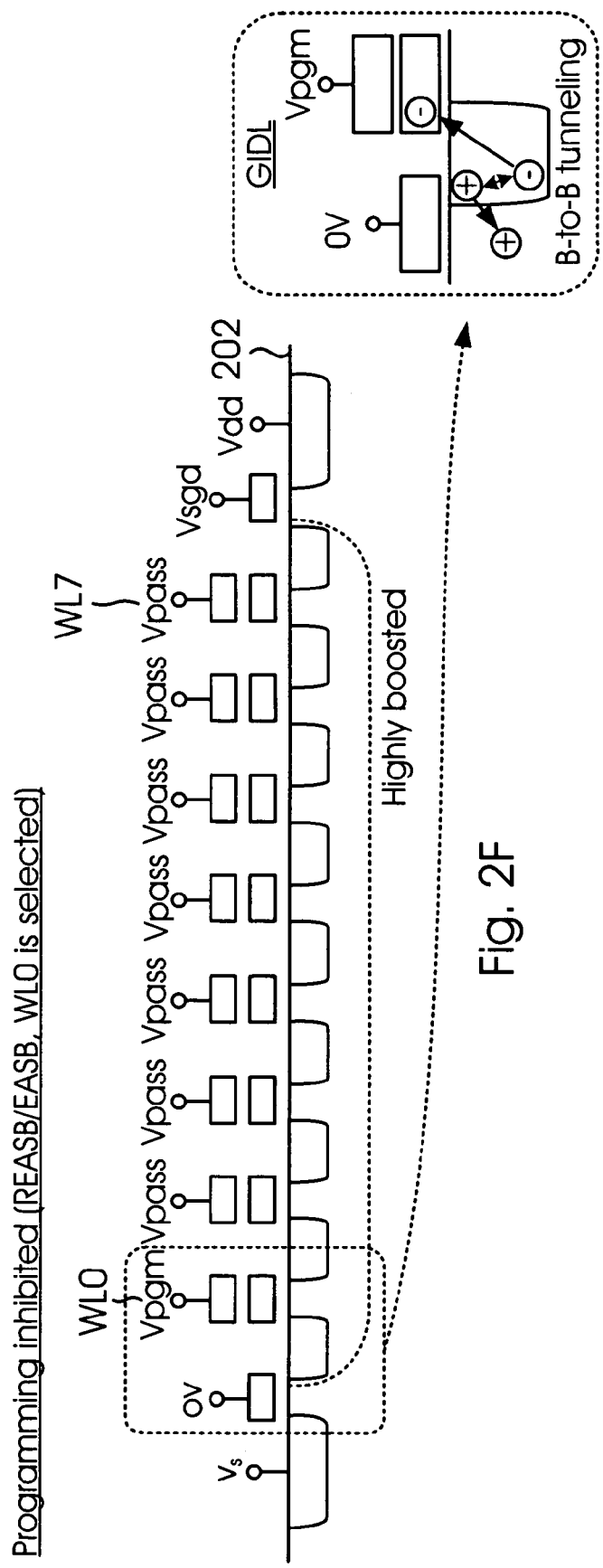
FIG. 2F shows the GIDL effect when word line WL0 is being programmed.

One technique to reduce GIDL, as shown in FIG. 2D, is to apply another voltage shown as VGP to the memory cell next to the cell being programmed. This is shown in FIG. 2E, where WL5 is being programmed, VGP is applied to WL4 and zero volts is applied to WL3. This reduces GIDL while programming WL1 to WLN, where N is the last word line. However, this technique fails when programming WL0, since there is no extra word line available. This is shown in FIG. 2F, where Vpgm is applied to WL0 and GIDL still occurs due to band-to-band (B-to-B) tunneling.

Another technique is to increase the distance between memory cell 228 and SGS. However, commercially, continuous effort is being made to keep the distance smaller.

In one aspect of the present invention, a dummy word line is used before WL0 to reduce GIDL. This will convert the 32 memory cell string into a 33 memory cell string. FIG. 4A shows an example of providing a dummy word line and FIG. 4B shows a programming table to program such a NAND string. Before describing the usage and programming of the dummy word line, the following provides an overall description of a flash memory system, with respect to FIG. 3A-B.

Flash Memory System General Description

Figure 3A:
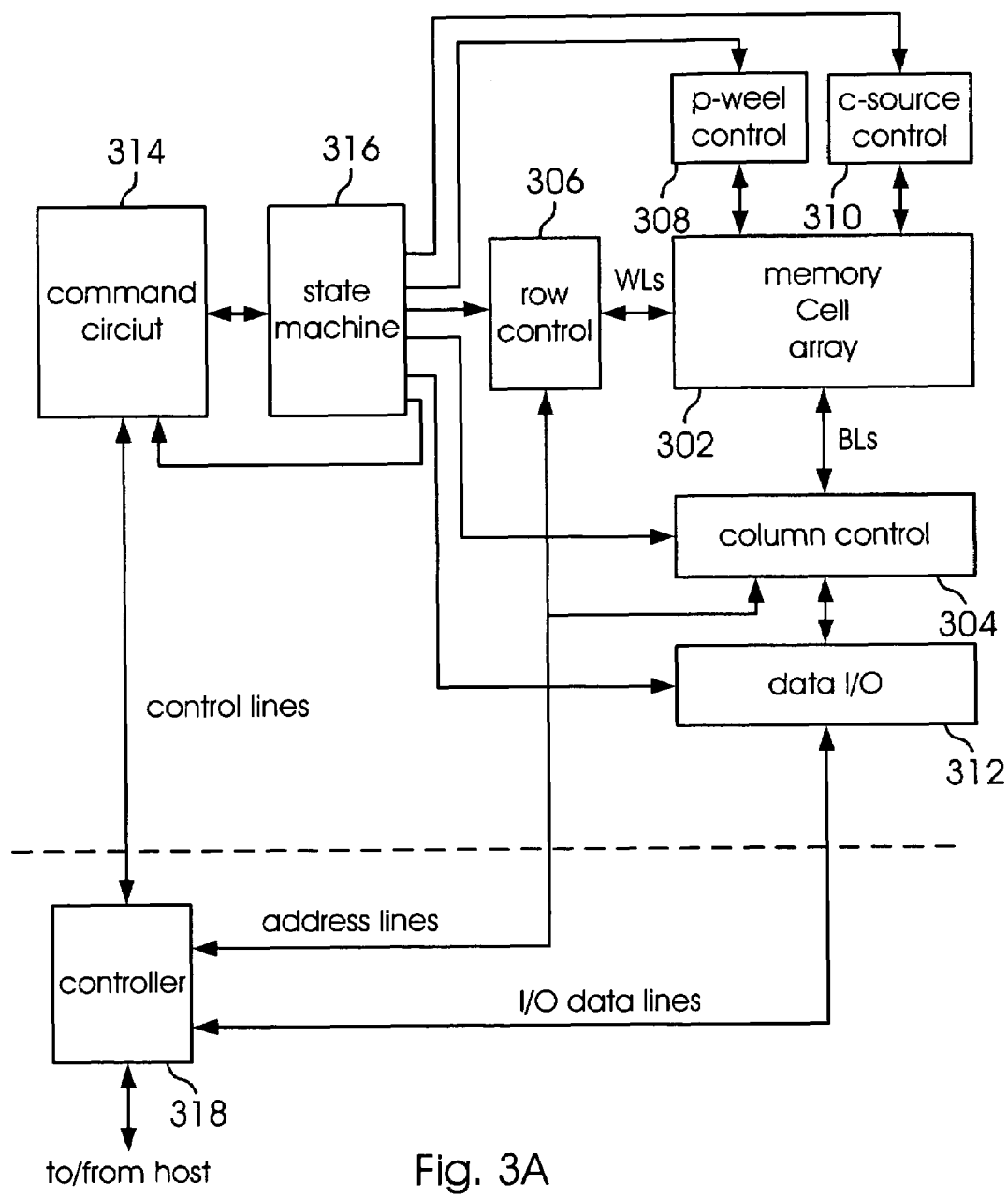
FIG. 3A is a block diagram of one embodiment of a non-volatile memory system in which the various aspects of the present invention are implemented.

FIG. 3A is a block diagram of one embodiment of a flash memory system that can be used to implement the present invention. Memory cell array 302 is controlled by column control circuit 304, row control circuit 306, c-source control circuit 310 and p-well control circuit 308. Column control circuit 304 is connected to the bit lines of memory cell array 302 for reading data stored in the memory cells, for determining a state of the memory cells during a program operation, and for controlling potential levels of the bit lines to promote the programming or to inhibit the programming. Row control circuit 306 is connected to the word lines to select one of the word lines, to apply read voltages, to apply a program voltage combined with the bit line potential levels controlled by column control circuit 304, and to apply an erase voltage. C-source control circuit 310 controls a common source line (labeled as "C-source" in FIG. 3B) connected to the memory cells. P-well control circuit 308 controls the p-well voltage.

The data stored in the memory cells are read by the column control circuit 304 and are output to external I/O lines via data input/output buffer 312. Program data to be stored in the memory cells are input to the data input/output buffer 312 via the external I/O lines, and transferred to the column control circuit 304. The external I/O lines are connected to controller 318.

Command data for controlling the flash memory device are input to controller 318. The command data informs the flash memory of what operation is requested. The input command is transferred to state machine 316 that controls column control circuit 304, row control circuit 306, c-source control 310, p-well control circuit 308 and data input/output buffer 312. State machine 316 can also output status data of the flash memory such as READY/BUSY or PASS/FAIL.

Controller 318 is connected or connectable with a host system such as a personal computer, a digital camera, or personal digital assistant, etc. It communicates with the host that initiates commands, such as to store or read data to or from the memory array 302, and provides or receives such data. Controller 318 converts such commands into command signals that can be interpreted and executed by command circuits 314, which are in communication with state machine 316. Controller 318 typically contains buffer memory for the user data being written to or read from the memory array.

One exemplar memory system comprises one integrated circuit that includes controller 318, and one or more integrated circuit chips that each contain a memory array and associated control, input/output and state machine circuits. The trend, of course, is to integrate the memory arrays and controller circuits of a system together on one or more integrated circuit chips. The memory system may be embedded as part of the host system, or may be included in a memory card (or other package) that is removably inserted into the host systems. Such a card may include the entire memory system (e.g. including the controller) or just the memory array(s) with associated peripheral circuits (with the controller being embedded in the host). Thus, the controller can be embedded in the host or included within a removable memory system.

Figure 3B:
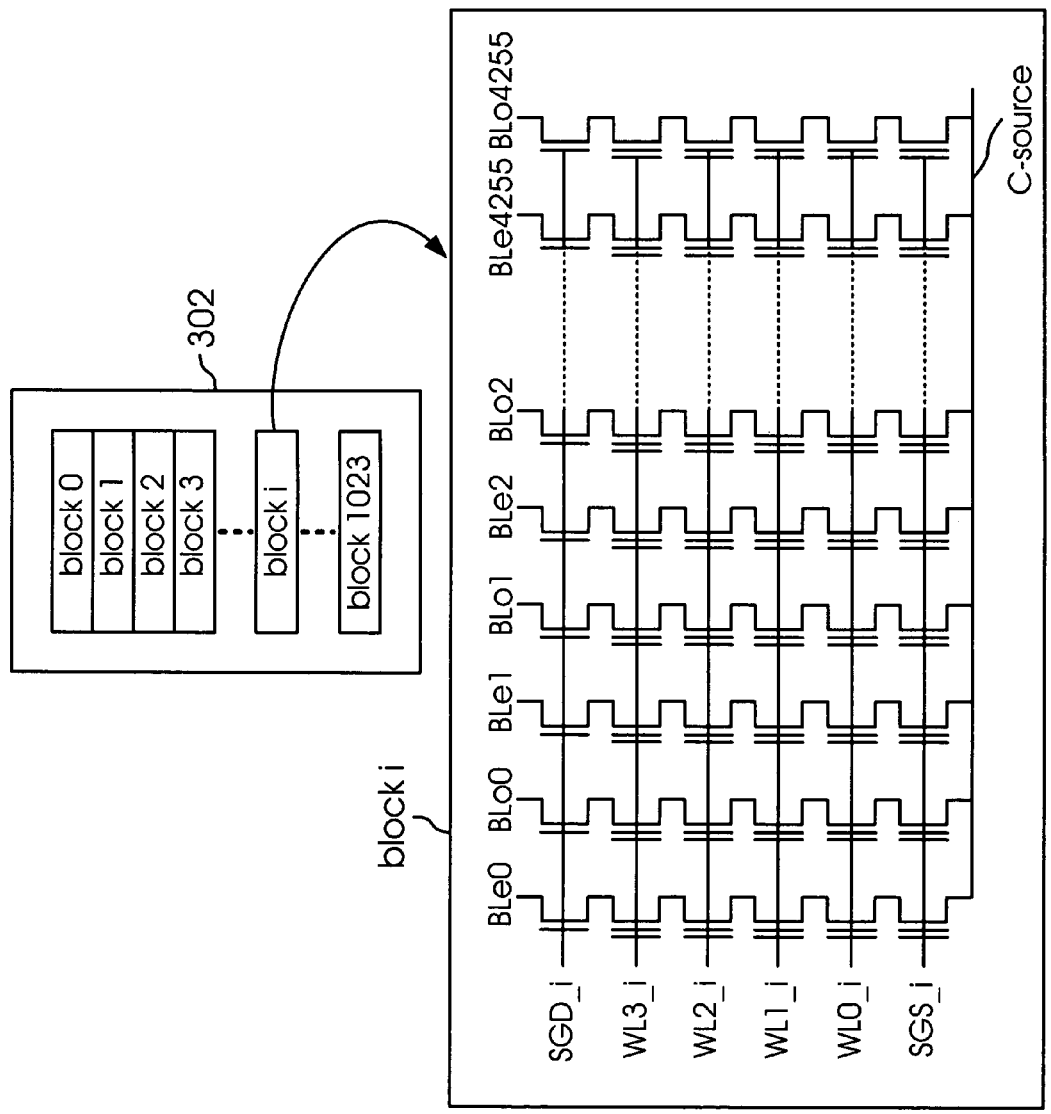
FIG. 3B shows an example of an organization of a memory array.
Figure 4A:
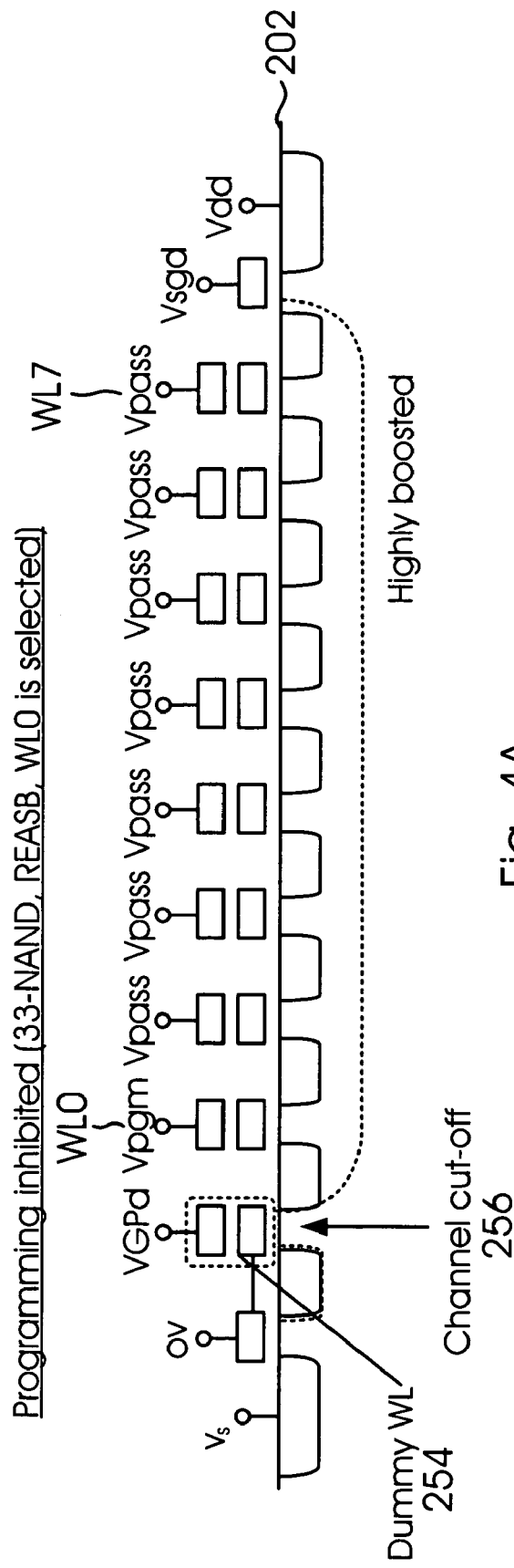
FIG. 4A shows a dummy word line according to one aspect of the present invention.

With reference to FIG. 3B, an example structure of memory cell array 302 is described. As one example, a NAND flash EEPROM is described that is partitioned into 1,024 blocks. The data stored in each block is simultaneously erased. In one embodiment, the block is the minimum unit of cells that are simultaneously erased. In each block, in this example, there are 8,512 columns that are divided into even columns and odd columns. The bit lines are also divided into even bit lines (BLe) and odd bit lines (BLo). FIG. 3B, as an example, shows four memory cells connected in series to form a NAND string. Although four cells are shown to be included in each NAND string, more or less than four can be used. One terminal of the NAND string is connected to a corresponding bit line via a first select transistor SGD, and another terminal is connected to c-source via a second select transistor SGS.

During read and programming operations, 4,256 memory cells are simultaneously selected. The memory cells selected have the same word line (e.g. WL2-i), and the same kind of bit line (e.g. even bit lines). Therefore, 532 bytes of data can be read or programmed simultaneously. These 532 bytes of data that are simultaneously read or programmed form a logical page. Therefore, one block can store at least eight pages. When each memory cell stores two bits of data (e.g. a multi-level cell), one block stores 16 pages.

Memory cells are erased by raising the p-well to an erase voltage (e.g. 20 volts) and grounding the word lines of a selected block. The source and bit lines are floating. Erasing can be performed on the entire memory array, separate blocks, or another unit of cells. Electrons are transferred from the floating gate to the p-well region and the threshold voltage becomes negative.

In the read and verify operations, the select gates (SGD and SGS) and the unselected word lines (e.g., WL0, WL1 and WL3) are raised to a read pass voltage (e.g. 4.5 volts) to make the transistors operate as pass gates. The selected word line (e.g. WL2) is connected to a voltage, a level of which is specified for each read and verify operation in order to determine whether a threshold voltage of the concerned memory cell has reached such level. For example, in a read operation, the selected word line WL2 is grounded, so that it is detected whether the threshold voltage is higher than 0V. In a verify operation, the selected word line WL2 is connected to 2.4V, for example, so that it is verified whether the threshold voltage has reached 2.4V or another threshold level. The source and p-well are at zero volts. The selected even bit lines (BLe) are pre-charged to a level of, for example, 0.7V. If the threshold voltage is higher than the read or verify level, the potential level of the concerned even bit line (BLe) maintains the high level, because of the non-conductive memory cell. On the other hand, if the threshold voltage is lower than the read or verify level, the potential level of the concerned even bit line (BLe) decreases to a low level, for example less than 0.5V, because of the conductive memory cell. The state of the memory cell is detected by a sense amplifier that is connected to the bit line. The difference between whether the memory cell is erased or programmed depends on whether or not negative charge is stored in the floating gate. For example, if negative charge is stored in the floating gate, the threshold voltage becomes higher and the transistor can be in enhancement mode.

The erase, read and verify operations described above are performed according to techniques known in the art. Thus, many of the details explained can be varied by one skilled in the art.

Dummy Word Line

In one aspect of the present invention, a dummy word line is provided between SGS and WL0, shown in FIG. 4A, to reduce GIDL when programming WL0. The dummy word line (shown as WLd 254) is not programmed to save any data. When WL0 is being programmed, VGPd is applied at WLd 254 and Vpass is applied to the rest of the unselected memory cells. GIDL is reduced because the channel is cut off (shown as 256, FIG. 4A) due to VGPd at WLd 254. VGPd can be lower than VGP since dummy WL is always erased and it provides weak electric field even at 0V.

Using an extra dummy word line increases the number of memory cells in a NAND string. For example, a 4 cell string becomes a 5 cell string, a 6 cell string becomes a 7 cell string, an 8 cell string becomes a 9 cell string, a 16 cell string becomes a 17 cell string and a 32 cell string becomes a 33 cell string.

It is noteworthy that although the dummy word line is shown to be before WL0 (FIG. 4A), it could also be provided after the last word line (for example, WL7). This will reduce GIDL induced program disturb while programming the cells along WL7.

Programming techniques for this extended string will be different than programming a standard string. FIG. 4B shows a table where programming voltages are compared between a standard 32-cell NAND string versus a 33 cell NAND string that uses a dummy word line 254.

Read Operation: Column 400A shows the voltages that are applied in a 33-cell NAND string and column 400B shows the voltages that are applied for a standard 32-cell NAND string during a read operation. A memory cell that is being read at any given time is applied a voltage of VCGRV (control gate read voltage). In one aspect, VCGRV varies from 0V to 3V. The unselected word lines and the dummy word line are applied VREAD, where VREAD is less than VCGRV.

Programming: Column 400C shows the voltages that are applied when a memory cell of a 33-cell NAND string is programmed. Column 400D shows the voltages that are applied when a standard 32-cell NAND string is programmed. When n is equal to 0, i.e. when WL0 is programmed, VPGM is applied to WL0, VGPd is applied to the dummy word line and Vpass is applied to the other unselected word lines. In one aspect VPGM varies from 15V to 20V and VGPd varies from 0V to 5V.

Erase: Column 400E shows the voltages that are applied during an erase operation for a 33-cell NAND string and column 400F shows the voltages that are applied during an erase operation in a standard 32-cell NAND string. The dummy word line in this case is erased when the entire block is being erased. This is performed to ensure that there are no residual charges in the dummy word line memory cell.

Soft Programming: Most erased or over-erased bits in flash memory cells are often associated with transistors which have a relatively low voltage level, e.g., a voltage level of approximately −3.0 V or less. When the voltage level of a transistor is too low, current may be conducted through the transistor. By way of example, leakage currents may flow through the transistor as a result of floating gates associated with the transistors substantially losing electrons. When current is conducted through the transistor due to a voltage that is very negative, the sensing and programming associated with the sector may occur less efficiently. Over-erased or most erased bits also generally take longer to erase than other bits and, as a result, substantially define the erase time associated with substantially all bits of the sector To correct for the most erased bits, voltage distribution in a memory cell may be shifted through the use of a process such as soft programming. Soft programming, as will be appreciated by those skilled in the art, generally involves applying a voltage which effectively shifts most erased bits to a higher voltage level. During soft programming, a relatively high voltage may be provided to a transistor which effectively causes electrons to be pulled onto the floating gate associated with the transistor. In other words, electrons may effectively be injected into the floating gate.

Column 400G shows the voltages applied to the word lines in a block that is being soft programmed in a 33-cell NAND string. Column 400H shows the voltages that are applied to the word lines in a block that is being soft programmed in a 32-cell NAND string. As shown in column 400G, the word lines in a selected block are applied VSPGM. If the dummy line is in the selected block, then VSPGM is applied to the dummy word line as well. In one aspect of the present invention, VSPGM ranges from 8V to 12V.

Figure 5:
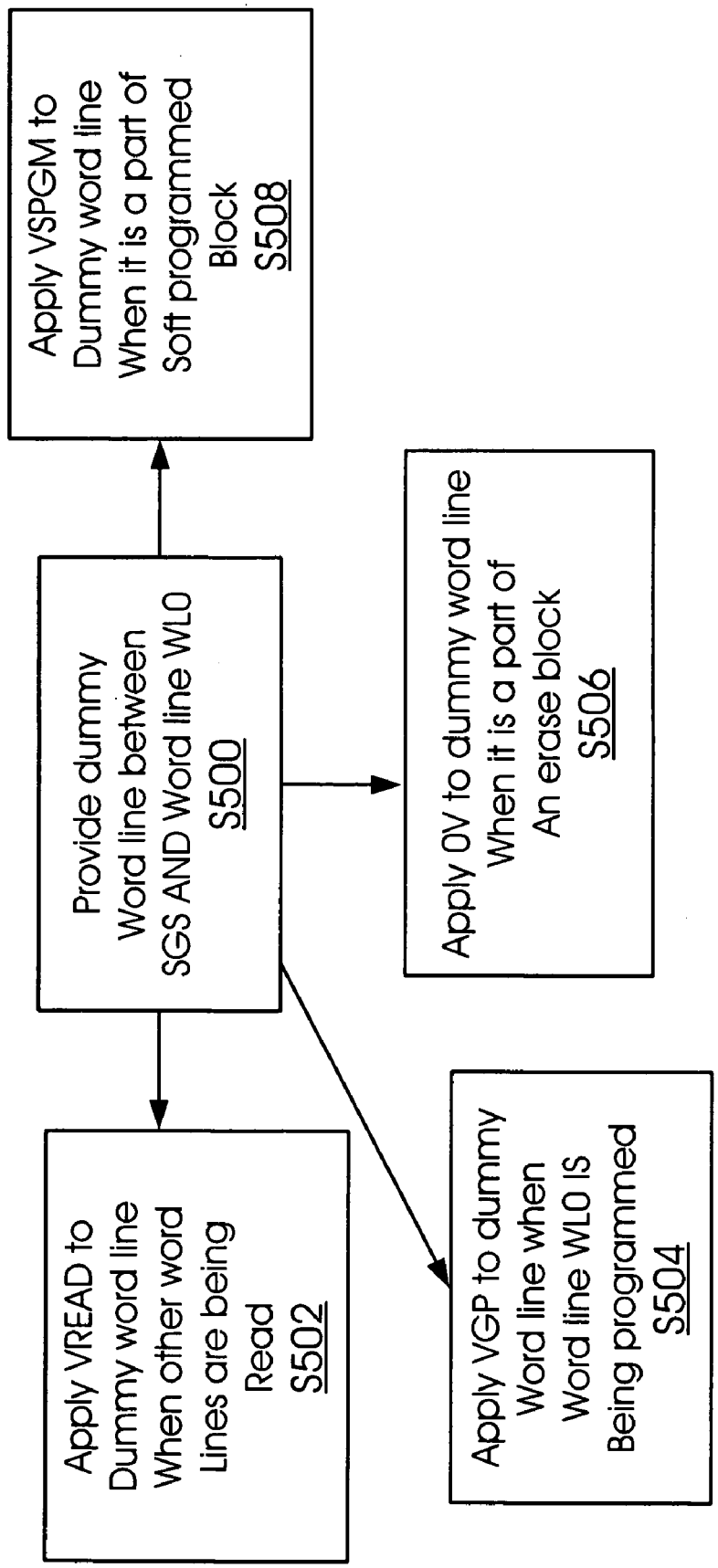
FIG. 5 shows a process flow diagram for a NAND string with a dummy word line, according to one aspect of the present invention.

FIG. 5 shows a process flow diagram for programming a NAND string, according to one aspect of the present invention. In step S500, a dummy word line is provided between SGS and WL0. In step S502, a voltage of VREAD is applied to the dummy word line, when other word lines are selected for a read operation.

In step S504, when WL0 is selected for programming, a voltage of VGP is applied to the dummy word line. VPGM is applied to WL0 and Vpass is applied to the other unselected word lines.

In step S506, a dummy word line is erased by applying 0 volts, if it is a part of an erase block.

In step S508, VSPGM is applied to the dummy word line, when it is a part of a block that is being soft-programmed.

In one aspect of the present invention, GIDL is reduced and programming is improved by providing a dummy word line between SGS and WL0.

Although the present invention has been described with reference to specific embodiments, these embodiments are illustrative only and not limiting. Many other applications and embodiments of the present invention will be apparent in light of this disclosure and the following claims.

What is claimed is:

1. A memory system, comprising:
   a plurality of non-volatile storage elements connected in a string between a source side element and a drain side element;
   a plurality of bit lines, wherein each bit line is connected to a plurality of non-volatile storage elements; and
   a plurality of word lines, the plurality of word lines include a dummy word line and a plurality of data word lines, the dummy word line is between a source side select line and a first word line of the data word lines, the first word line is connected to a first non-volatile storage element to be programmed, wherein a program voltage is applied to the first word line and a cut-off voltage is applied to the dummy word line while the program voltage is applied to the first word line, a boost voltage is applied to at least some of the data word lines while the program voltage is applied to the first word line and the cut-off voltage is applied to the dummy word line.

2. The memory system according to claim 1, wherein the plurality of non-volatile storage elements comprise a NAND string of flash memory cells.

3. The memory system according to claim 1, wherein zero volts are applied on the source side select line while applying the cut-off voltage to the dummy word line.

4. The memory system of claim 1, wherein a soft program voltage is applied to the plurality of word lines when a block of non-volatile storage elements are soft programmed.

5. The memory system of claim 1, wherein the first non-volatile storage element is connected to the first word line and a second non-volatile storage elements is connected to the dummy word line, the first and second non-volatile storage elements are erased when a set of non-volatile storage elements are erased together.

6. The memory system of claim 1, wherein the first non-volatile storage element that is programmed is associated with a first bit line of the plurality of bit lines and a second non-volatile storage element that is connected to the dummy word line and associated with a second bit line of the plurality of bit lines is not programmed.

7. The memory system of claim 1, wherein the cut-off voltage is 0V to 5V.

8. The memory system of claim 1, wherein the boost voltage boosts channels of non-volatile storage elements that are associated with a first bit line of the plurality of bit lines and that receive the boost voltage.

9. The memory system of claim 8, wherein a program inhibit voltage is applied to the first bit line while the program voltage and the cut-off voltage are applied and the cut-off voltage cuts off a channel associated with a dummy non-volatile storage element, the dummy non-volatile storage element is connected to the dummy word line and is associated with the first bit line.

10. A memory system, comprising:
a plurality of NAND strings of non-volatile storage elements, a first of the NAND strings includes a dummy non-volatile storage element and a plurality of data non-volatile storage elements, a first of the data non-volatile storage elements is a neighbor to the dummy non-volatile storage element;
a plurality of word lines associated with the plurality of NAND strings, the plurality of word lines includes a dummy word line that is associated with the dummy non-volatile storage element and a plurality of data word lines that are associated with the plurality of data non-volatile storage elements, a first of the data word lines is associated with the first data non-volatile storage element, the dummy word line is between a source side select line and the first word line; and
management circuitry applies a program voltage to the first word line while applying a boost voltage to at least a portion of the other data word lines while applying a cut-off voltage to the dummy word line while inhibiting programming of the first NAND string.

11. The memory system according to claim 10, wherein the management circuitry applies zero volts on the source side select line while applying the cut-off voltage to the dummy word line.

12. The memory system of claim 10, wherein the management circuitry applies a soft program voltage to the dummy word line and the data word lines when a block of non-volatile storage elements are soft programmed.

13. The memory system of claim 10, wherein the management circuitry erases the dummy non-volatile storage element and the plurality of data non-volatile storage elements when the plurality of NAND strings are erased together.

14. The memory system of claim 10, wherein the boost voltage boosts channels of non-volatile storage elements associated with the first NAND string that receive the boost voltage.

15. The memory system of claim 10, wherein the cut-off voltage cuts off a channel of the dummy non-volatile storage element.

16. A method of programming a memory system, comprising:
applying a program voltage to a first word line of a plurality of word lines, the plurality of word lines include the first word line, a plurality of unselected word lines and a dummy word line, the first word line is a neighbor to the dummy word line, the plurality of word lines are associated with a plurality of bit lines;
applying a boost voltage to at least a set of the unselected word lines, the boost voltage boosts channels of non-volatile storage elements that are associated with the set of the unselected word lines and are associated with a first bit line of the plurality of bit lines;
applying a program inhibit voltage to the first bit line, the first bit line is associated with a dummy non-volatile storage element that is connected to the dummy word line; and
applying a cut-off voltage to the dummy word line, the cut off voltage cuts off a channel of the dummy non-volatile storage element, the program voltage, the boost voltage, the program inhibit voltage and the cut-off voltage are applied over a common time interval.

17. The method according to claim 16, further comprising applying zero volts on a source side select element associated with the first bit line while applying the cut-off voltage to the dummy word line.

18. The method of claim 16, further comprising applying a soft program voltage to the plurality of word lines when a block of non-volatile storage elements are soft programmed.

19. The method of claim 16, further comprising erasing a block of non-volatile storage elements that are associated with the plurality of word lines, the erasing includes erasing the dummy non-volatile storage element.

* * * * *